United States Patent
Ebnabbasi et al.

(10) Patent No.: US 9,568,568 B2
(45) Date of Patent: Feb. 14, 2017

(54) APPARATUS AND METHOD OF MEASURING PERMEABILITY OF A SAMPLE ACROSS WHICH A DC VOLTAGE IS BEING APPLIED

(71) Applicant: Northeastern University, Boston, MA (US)

(72) Inventors: Khabat Ebnabbasi, Boston, MA (US); Carmine Vittoria, Charlestown, MA (US)

(73) Assignee: Northeastern University, Boston, MA (US)

( * ) Notice: Subject to any disclaimer, the term of this patent is extended or adjusted under 35 U.S.C. 154(b) by 106 days.

(21) Appl. No.: 14/386,918

(22) PCT Filed: Mar. 15, 2013

(86) PCT No.: PCT/US2013/032645
§ 371 (c)(1),
(2) Date: Sep. 22, 2014

(87) PCT Pub. No.: WO2013/142388
PCT Pub. Date: Sep. 26, 2013

(65) Prior Publication Data
US 2015/0035522 A1    Feb. 5, 2015

Related U.S. Application Data

(60) Provisional application No. 61/614,828, filed on Mar. 23, 2012.

(51) Int. Cl.
*G01R 33/12* (2006.01)

(52) U.S. Cl.
CPC ................. *G01R 33/1223* (2013.01)

(58) Field of Classification Search
CPC .................................................. G01R 33/1223
(Continued)

(56) References Cited

U.S. PATENT DOCUMENTS

| | | | | |
|---|---|---|---|---|
| 2,468,154 A | * | 4/1949 | Ashworth | G01R 33/1223 324/227 |
| 3,265,964 A | * | 8/1966 | Hunsaker | G01N 27/80 324/226 |

(Continued)

OTHER PUBLICATIONS

Ebnabbasi, et al., "Magneto-electric Effects on Sr Z-Type Hexaferrite at Room Temperature," J. Appl. Phys., vol. 111, 07C719-1-07C719-3 (2012).

(Continued)

*Primary Examiner* — Jay Patidar
(74) *Attorney, Agent, or Firm* — Hamilton, Brook, Smith & Reynolds, P.C.

(57) ABSTRACT

An apparatus and method, directed to measuring permeability of a magnetoelectric sample, are described. The apparatus includes a sample holder configured to present the magnetoelectric sample to a permeability analyzer for measurement of the sample's permeability, and to facilitate application of a DC voltage to the sample in a way that isolates the DC voltage from the permeability analyzer. The described apparatus and method may be used to measure the permeability values associated with the magnetoelectric sample with respect to a range of DC voltages applied to the sample, while protecting the measuring instrumentality from damage from the applied DC voltages.

20 Claims, 8 Drawing Sheets

(58) Field of Classification Search
USPC .................................. 324/201, 202, 238–243
See application file for complete search history.

(56) References Cited

U.S. PATENT DOCUMENTS

| | | | |
|---|---|---|---|
| 6,630,833 | B2 | 10/2003 | Scott |
| 7,887,377 | B1 | 2/2011 | Wallace |
| 8,476,896 | B2 * | 7/2013 | Mednikov ................ G01B 7/14 |
| | | | 324/202 |
| 2009/0270262 | A1 | 10/2009 | Kim et al. |

OTHER PUBLICATIONS

International Search Report and Written Opinion issued by the U.S. Patent and Trademark Office as International Searching Authority for International Application No. PCT/US13/032645 mailed Jun. 14, 2013 (10 pgs.).

Ebnabbasi, et al., "Room Temperature Magnetoelectric Effects on Single Slabs of Z-Type Hexaferrites," Department of Elec Eng and Comp Sci, Northeastern University, Boston, MA. Submitted Nov. 23, 2011. Retrieved on May 21, 2013 from <URL:http://www.jpier.org/PIERB/pierb23/08.10061103.pdf> (6 pgs.).

Blaz, et al., "Modeling and Characterization of Frequency and Temperature Variation of Complex Permeability of Ferrite LTCC Material," Progress in Electromagnetics Research B, vol. 23, pp. 131-146 (2010).

Ferrite Materials Survey. Ferroxcube. Sep. 1, 2008. Retrieved on May 23, 2013 from <URL:http://www.ferroxcube.com/prod/assets/sfmatgra_ftnt.pdf> (4 pgs.).

\* cited by examiner

APPARATUS AND METHOD OF MEASURING PERMEABILITY OF A SAMPLE ACROSS WHICH A DC VOLTAGE IS BEING APPLIED

CROSS-REFERENCE TO RELATED APPLICATION

This application claims priority from U.S. Provisional Application Ser. No. 61/614,828, filed Mar. 23, 2012, entitled "A Device For Direct Microwave Measurement of Permeability as a Function of High DC Voltage" which is incorporated herein by reference.

STATEMENT REGARDING FEDERALLY SPONSORED RESEARCH OR DEVELOPMENT

This invention was made in part with government support under Grant No. DMR-1002543, awarded by the National Science Foundation. The United States government has certain rights in this invention.

BACKGROUND

Magnetic materials such as ferrites are widely used in passive and tunable electromagnetic signal processing, devices, such as phase shifters, circulators, isolators, filters, antenna substrates, and EMI suppression cores. Due to their excellent dielectric properties, they possess the advantages of low loss and high power handling capability relative to semiconductors. Usually, parameters of magnetic materials are controlled by an external magnetic field and/or permanent magnets thus allowing for tuning of device performances. Permanent magnets or current driven coils imply relatively large component size, weight, and cost, as well as slow response time in comparison to semiconductor based technologies.

Magnetoelectric (ME) materials are a practical solution in controlling the magnetic materials by tuning the electric field and/or voltage instead of external magnetic fields and would eliminate permanent magnets and tuning coils to overcome most of the disadvantages in the use of magnetic materials for devices such as ferrite microwave devices. This introduces the possibility of circuits where magnetic materials and semiconductors can be used on the same integrated chip. Furthermore, key advantages of magnetic materials, including low insertion loss and high power handling capability can be exploited without the penalty of added size, weight, and cost, as well as increased response time.

For these reasons, developing tools for analyzing ME materials has gained considerable importance. Although most often ME materials are operational at low temperatures, certain materials, such as hexaferrite of the Z-type (Sr—Z), are intrinsically magnetoelectric at room temperature, exhibiting strong magnetoelectric coupling coefficient. Previous reports on ME hexaferrite materials measured the DC properties of these materials upon the application of DC magnetic field. For example, the low frequency (~1 kHz) dielectric constant has been measured as a function of DC magnetic field. Since these materials are ME, it is possible to measure the permeability of the material with the application of DC voltage (electric field). Measurement of permeability is critical for optimization of circuit design, especially in high-frequency application. However, permeability measurements require the use of a coaxial line setup, which has never before been used with applications of high DC voltage.

SUMMARY

A sample holder and a coaxial method of measuring the permeability of magnetoelectric materials as a function of applied DC voltage are described. The sample holder reduces electromagnetic radiation losses as compared to conventional devices. The connections in the sample holder are electrically isolated from measuring equipment, preventing damage. A complementary algorithm to analyze the signal from the sample and calculate the permeability of the sample is described.

In one aspect, a method for measuring permeability includes (i) providing a sample in a sample holder comprising: a doughnut-shaped sample positioned in electrical contact with an interior wall of a cylindrical conductive shield at a terminal end of the conductive shield; a conductive plate juxtaposed to the terminal end of the conductive shield, said conductive plate spaced apart and electrically isolated from the conductive shield and in electrical contact with the sample; and a conducting cable passing through a conducting end of the conductive shield and in electrical contact with the sample; (ii) connecting a conducting end of the cable to a permeability analyzer that emits an electric AC signal and collects a reflected electric AC signal from the sample in the sample holder; (iii) applying a DC voltage between the conductive shield and the conductive plate, establishing an electrical field across the sample; and (iv) calculating the permeability of the sample.

In one or more embodiments, further includes calibrating the reflected signal from the sample holder with the sample to that of the sample holder without the sample.

In one or more embodiments, further includes applying a capacitance between the conductive shield and the conductive plate.

In one or more embodiments, further includes magnetically polarizing the sample before providing the sample.

In one or more embodiments, the sample is magnetoelectric.

In one or more embodiments, the sample is Sr—Z hexaferrite.

In one or more embodiments, wherein the sample has resistivity below $10^7$ Ω·cm.

In one or more embodiments, the sample has a thickness of less than 0.6 cm.

In one or more embodiments, the permeability analyzer is a network analyzer.

In another aspect, a kit for use in measuring permeability, includes (i) a sample holder including a cylindrical conductive shield having a first conducting end and a second terminal end, the first conductive end configured to receive and position a conducting cable longitudinally within the conductive shield; a conductive plate sized to close off the terminal end of the conducting shield, an insulating ring having an inner diameter that is substantially similar to an inner diameter of the conducting shield; and (ii) instructions for assembling the sample holder.

The inner diameter of the insulating ring is substantially similar to the inner diameter of the shield because an insulating ring with an inner diameter substantially smaller than the inner diameter of the shield would prevent electrical contact of the sample with the plate and an insulating ring with an inner diameter substantially larger than the inner diameter of the shield would not electrically isolate the shield from the plate.

In one or more embodiments, the instructions further include instructions for establishing a DC electric field in a sample positioned in an assembled sample holder, receiving and transmitting a signal along a conductive cable positioned in the sample holder, and calculating the permeability of a sample positioned in an assembled sample holder.

In one or more embodiments, the instructions further include instructions for calibrating the signal received from the sample holder.

In another aspect, a permeability measuring system includes (i) a sample holder having a hollow, cylindrical conductive shield having two open ends, a conducting end and a terminal end, configured to house a conducting cable with a smaller diameter than that of the conductive shield, the conducting cable having a conducting end and a terminal end to be aligned with the terminal opening of the shield, a conductive plate sized to close off the terminal end of the conducting shield and configured to be juxtaposed to the terminal end of the conducting shield, and an insulating sheet configured to be disposed between the conductive shield and the conductive plate and; (ii) a DC voltage supply for establishing a voltage difference between the conductive shield and the conductive plate, to create an electric field through a sample configured to fill the space between the conducting cable and the conductive shield and to be in electrical contact with the conductive shield and the conductive plate; and (iii) a permeability analyzer that emits a signal and collects reflected signal from the sample holder via the cable in order to measure the permeability of the sample as a function of applied voltage.

In one or more embodiments, the voltage difference is between 0 and 1000V.

In one or more embodiments, the electric field established through the sample is perpendicular to sample thickness.

In one or more embodiments, the system further includes an external capacitor connected between the plate and the shield.

In one or more embodiments, the insulating sheet includes Teflon or Mylar.

In one or more embodiments, the insulating sheet has a thickness of less than its skin depth.

In one or more embodiments, the capacitor has capacitance greater than 0.22 microfarads.

In one or more embodiments, the permeability analyzer is a network analyzer.

BRIEF DESCRIPTION OF THE DRAWINGS

The features and advantages of certain embodiments are illustrated in the accompanying drawings, which are presented for the purpose of illustration only and are not intended to be limiting of the invention.

DETAILED DESCRIPTION

Magnetoelectric materials that change magnetic properties with response to electric fields can be used in passive and tunable electromagnetic signal processing devices. However, for their successful integration into semiconductor circuits, their permeability as a function of voltage must be accurately measured.

Coaxial line techniques to measure $\mu_r$ (permeability) and $\in_r$ (permittivity) are known. However, these measurements were never performed in high DC voltage. One reason for this is that high DC voltage could easily damage delicate microwave testing instrumentation. Conventional measuring techniques do not permit the use of high DC voltage in testing or characterization of microwave parameters, since there is no provision to isolate high voltage from the instrumentation. Additionally, the known modifications of these conventional devices to apply moderate voltages results in radiation loss and lowered measurement accuracy.

Figure 1:
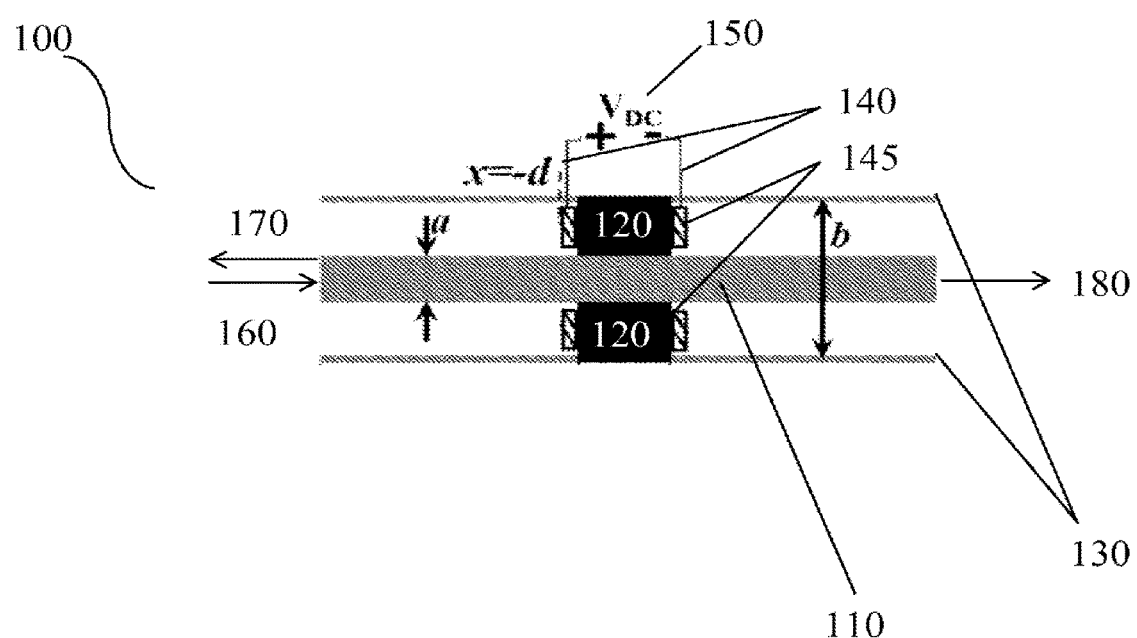
FIG. 1 shows a schematic of a conventional two port coaxial line setup for permeability measurements of a magnetoelectric sample.

In a conventional coaxial line measurement setup, mostly the two ports or transmission through lines are used to measure the constitutive parameters like permeability. As shown in cross-section in FIG. 1, the setup involves a conductive cable (e.g. a center conductor) 110, the toroidal or donut-shaped sample 120 surrounding the cable, a hollow, cylindrical conductive shield 130, and wire connections 140 connected with silver paint 145 for application of DC voltage 150. Signal 160 travels via the conductive cable from a permeability analyzer (e.g. measuring equipment or a network analyzer, not shown) and the reflected 170 and transmitted 180 signal is collected by the permeability analyzer.

Figure 2:
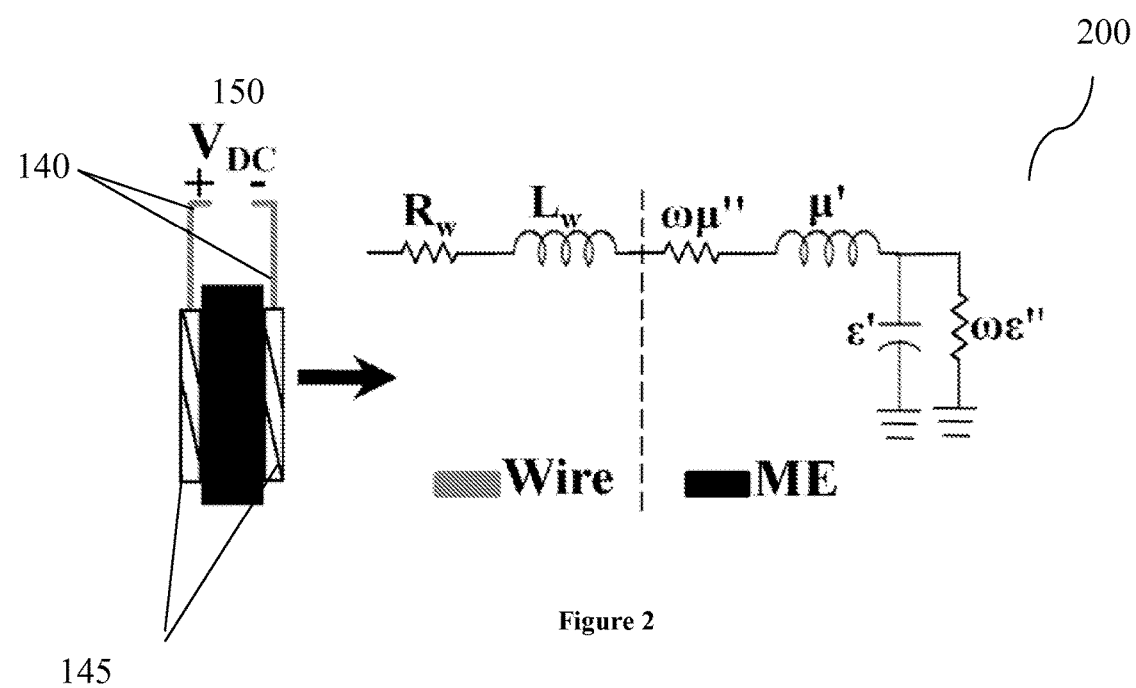
FIG. 2 shows a circuit model of a sample in a conventional two-port coaxial line setup in connection with dangling wires.

In conventional techniques, phase adjustment of the signal can be performed by knowing the sample thickness and its distance from the port of the network analyzer. If a very thin conductor like diluted silver paint 145 along with thin wires 140 are used to apply a DC voltage 150 through the sample in the coaxial line, uncertainty in the accuracy of the measurement results from the radiation effects from the wire. The circuit model 200 of the wire in contact with the ME material is given in FIG. 2. The wires influence the measurement precision. Although it is possible to cancel out its effect through calibration techniques, the dangling of the wires and their position is not fixed, making it difficult to remove its effect precisely with calibration. In order to properly characterize ME materials, the material should experience the DC voltage with no external radiation effects due to contacts to the sample.

The method and sample holder presented herein eliminate the problem radiation loss and allow for the application of high voltages during permeability measurements. The one port setup disclosed herein utilizes a modified sample holder. As shown in cross-section in FIG. 3, in one embodiment, the sample holder setup 300 involves a conductive cable 310, the toroidal sample 320 surrounding the cable, a hollow, cylindrical conductive shield 330, and an isolated conductive plate 340. An insulating sheet 345 is used to electrically isolate the plate 340 from the shield 330. A thin conductor 350 is applied to the sample 320 to electrically connect the sample to the shield 330 for application of DC voltage 355 from a DC voltage supply (not shown). Thus, DC voltage is applied outside the coaxial line. The conductor 350 should not touch the conducting cable 310 as the application of high DC voltages to the cable would damage the connected permeability analyzer. An external capacitor 360 is applied between the plate 340 and the conductive shied 330. Signal 370 travels via the conductive cable or line from a permeability analyzer (e.g. a network analyzer, not shown) and the reflected 380 signal is collected by the permeability analyzer. In general, permeability (network) analyzers generate electric signals at different frequencies and measures reflected and transmitted signals through conducting cables.

Figure 3:
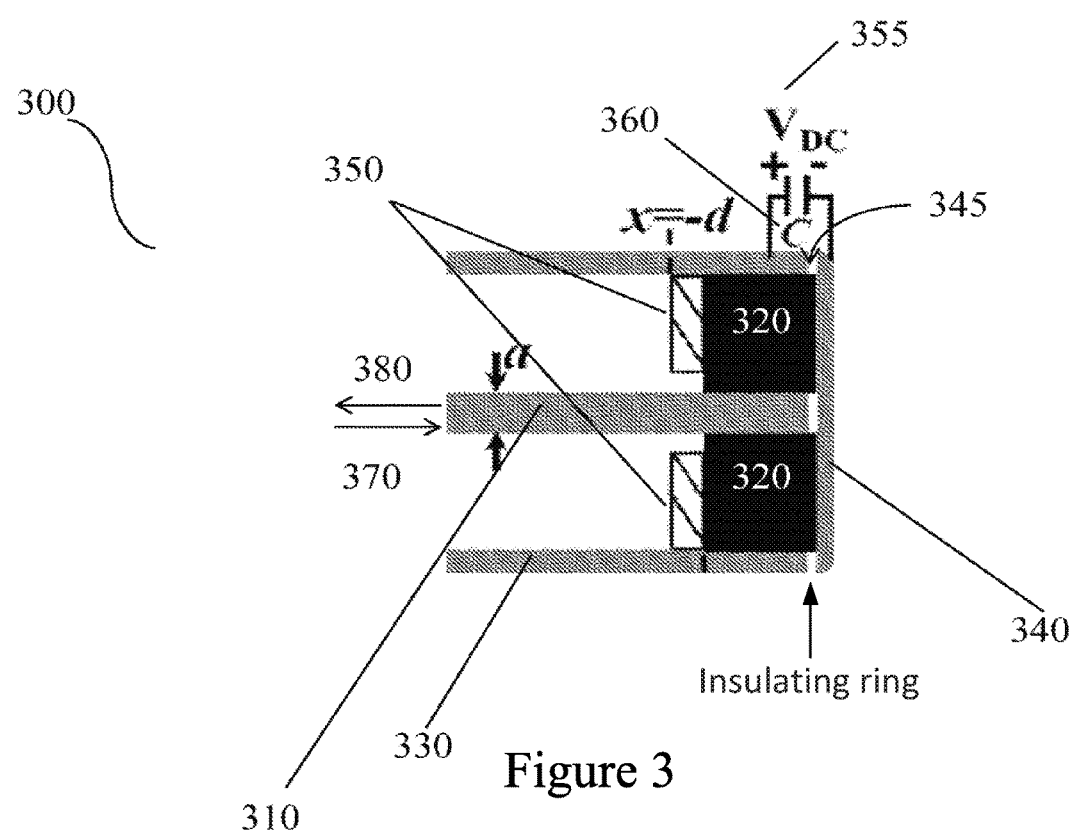
FIG. 3 shows a schematic of the one port coaxial line setup for permeability measurements of a magnetoelectric sample in a sample holder, according to one or more embodiments of the current disclosure.

As shown in FIG. 3, the sample holder allows for measurement of the constitutive parameters of the ME material (permeability and dielectric constant) while maintaining isolation of the DC voltage from the coaxial line and instrumentation. In this design wire connections were eliminated and isolation between the DC voltage and microwave equipment was achieved. Additionally, an insulating capacitor 360 (C) is used to short out radiation losses in the gap between the conductive shield 330 and the isolated plate 340.

In some embodiments, the conductive shield 330 is cylindrical. In other embodiments, the shield has an asymmetric, polygonal, or arbitrary cross section.

The insulating sheet 345 can be Teflon, Mylar, or any other non-conductive material. The thickness of the insulating sheet is 10 mils or <<skin depth of the insulating sheet.

The thin conductor 350 can be silver paint, conductive epoxy, or any other conductive adhesive material. In some embodiments, liquid silver paint is preferred because of the convenience in control of (a) resistivity, (b) thickness, (c) coating on the toroid, and (d) removing from the surface.

As shown in FIG. 3, the conductor 350 was used to connect the DC voltage to the toroidal sample. In some embodiments, one side of the ME material is painted with a conductor, such as silver paint, so that the electric field from the applied voltage 355 is perpendicular to the toroidal plane. The conductive plating 350 might reflect the electromagnetic wave signal 370 and affect the precision of measurement. Thus, the thickness of the conductive metallic surface needs to be well below the skin depth. In this case, most of the electromagnetic energy is coupled to the toroid. In some embodiments, the thickness of the conductor is In conductors, most of applied AC electrical current flows between the surface of the conductor and the skin depth, d, which depends on the frequency of the current and the electrical and magnetic properties of the material. As skin depth is inversely proportional to the conductivity, the resistivity of the conductor 350 was increased by diluting the silver paint in acetone with 1:3 ratio.

The capacitor 360 can be a 0.22 microfarad capacitor or greater for the frequency range of 1-3 GHz The purpose of the capacitor is to short out the coaxial across the gap created by the insulating sheet 345 at high frequencies. In some embodiments, the capacitor is an commercially available capacitor.

For accurate measurements, the thickness of the toroidal or donut-shaped sample 320 is preferably much less than the wavelength of the signal propagating in the cable. In one embodiment, the thickness of the sample was 0.1 cm. The thickness of the sample can be less than 0.6 cm In some embodiments, the sample is donut-shaped, in other embodiments, the sample shape can be rounded, oblong, polygonal, or of any other shape. In some embodiments, the sample is shaped to fill the space between the cable and the conductive shield in the sample holder.

The donut-shaped sample material can be any magnetoelectric material. For example, the sample material is Sr—Z hexaferrite, $Sr_3Co_2Fe_{24}O_{41}$ or $SrCo_2Ti_2Fe_8O_{19}$. In some embodiments, the material is magnetoelectric at room temperature.

In some embodiments, high resistivity of the material is critical in order to minimize current flow through the sample in the presence of high electric fields. In one embodiment, the resistivity of a hexaferrite sample was estimated from experimental linear 1-V characteristic measurement as $1.4 \times 10^9$ $\Omega \cdot cm$ for a toroid with 1 mm thickness. In some embodiments, the resistivity is below $10^7$ $\Omega \cdot cm$.

In some embodiments, as shown in FIG. 3, one side of the toroid sample 320 is shorted to the coaxial line termination as well as to the DC ground voltage. The other side of the toroid is coated with a thin film of silver paint and then connected to a high DC voltage power supply (not shown). The experimental advantages of this setup are: (1) the high DC voltage is isolated from the microwave signal of the Network Analyzer (NA) instrumentation, and (2) the radiation effects from dangling wires connected to the toroidal sample are eliminated. Radiation effects were prevented by connecting high frequency capacitors to electrically short out any microwave signals and to connect the DC isolated plate 340 to the grounded body of the coaxial line (not shown). In addition, (3) the thickness of the silver paint film can be made sufficiently small compared to the skin depth so that the reflected signal from the toroid is not dominated by pure metallic reflections from the silver paint. The setup can be used to apply DC voltage to the toroidal sample and measured changes in $\mu_r$ as a function of the DC voltage.

Figure 4:
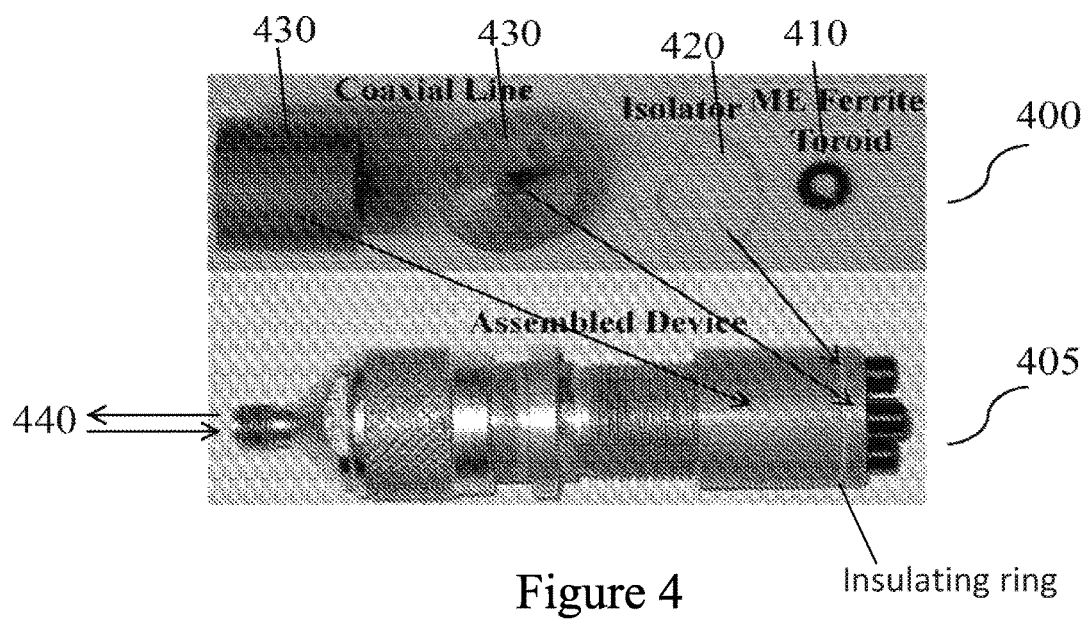
FIG. 4 shows photographs of the disassembled and assembled sample holder, according to one Of more embodiments of the current disclosure.

Photographs of the disassemble 400 and assembled 405 sample holder according to one embodiment are shown in FIG. 4. The torroidal sample 410, the insulating sheet 420, the isolated conductive plate 430, and the conductive shield 430 are shown. Arrows indicate where these disassembled parts can be seen in the assembled device 405. A conducting cable (not shown) is positioned inside the sample holder and signal 440 travels to and from the network analyzer through the cable.

With the one port transmission line as used herein the relative permeability, $\mu_r$, can be calculated from the reflection coefficient, $S_{11}$:

$$jZ\tan(kt) = Z_0 \left( \frac{1 + S_{11}^s}{1 - S_{11}^s} \right) \quad (1)$$

where $Z=\sqrt{\mu/\epsilon}$ and $k=\omega\sqrt{\mu\epsilon}$.

Here $S_{11}^s$, Z, k, and $Z_0$ are, respectively, the reflection coefficient for the shorted port (terminal end) of the coaxial transmission line, the coaxial line characteristic impedance of the sample, the propagation constant which is equal to $2\pi/\lambda$, and the characteristic impedance of the coaxial line which is 50Ω in one embodiment. The permeability may then be determined from:

$$\mu \simeq Z_0 \left(\frac{1}{j\omega t}\right)\left(\frac{1+S_{11}^s}{1-S_{11}^s}\right) \qquad (2)$$

where ω is 2πf (f is frequency). This is an approximate formula and it is valid as long as kt<<1. The advantage of this approach is that the dielectric constant, ∈, does not enter in the analysis in this limit of approximation.

Figure 5:
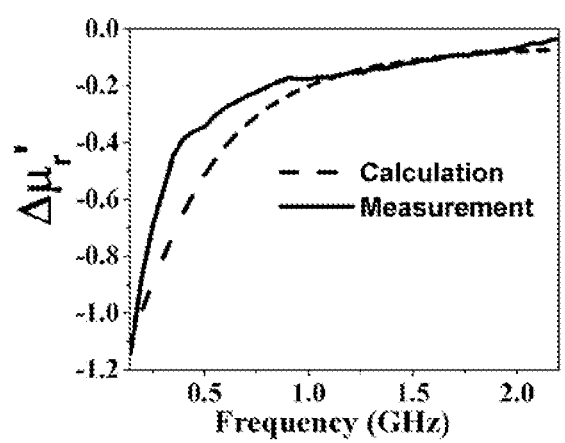
FIG. 5 shows a plot of theoretical and measured values for magnetic permeability change versus frequency in E=5 kV/cm, according to one or more embodiments of the current disclosure.

For E≠0 (application of DC voltage) the theoretical calculation and experimental measurements (for an embodiment with a hexaferrite sample of 1 mm thickness and 1.4×10⁹ Ω·cm, for E=5 kV/cm) for the change in permeability is shown in FIG. 5 (note: similar curves may be obtained for equivalent electric fields). The calculated formula for the changes in real part of permeability ($\Delta\mu'_r$) is:

$$\frac{\Delta\mu'_r}{\mu(0)} \simeq \left[\left(\frac{H_\phi H_1}{H_\phi H_1 - \omega^2/\gamma^2}\right)\frac{\Delta M_\tau}{M_\tau}\right]\left(\frac{\alpha Z_0}{1+\omega^2\tau^2}\right), \qquad (3)$$

with respect to the direction of $\vec{E}$ relative to $\vec{M}$ (magnetization). $H_\phi$, $M_r$, τ, and α are azimuth magnetic anisotropy field, remanence magnetization, electric relaxation time, and magnetoelectric coupling, respectively. $H_1 = H_\phi + H_\theta$ and γ=2πg1.4×10⁶ Hz/Oe, $H_\theta$ is uniaxial magnetic anisotropy field.

Figure 6:
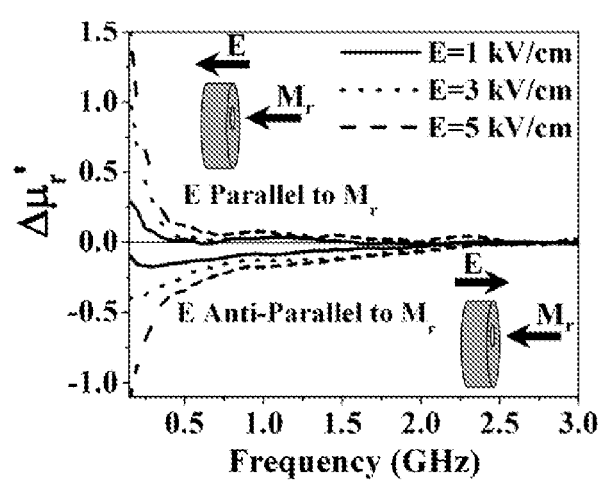
FIG. 6 shows a plot of measured values of permeability change versus electric field and frequency when $M_r$ (remanence magnetization) is parallel and anti-parallel to E (Electric field), according to one or More embodiments of the current disclosure.
Figure 7:
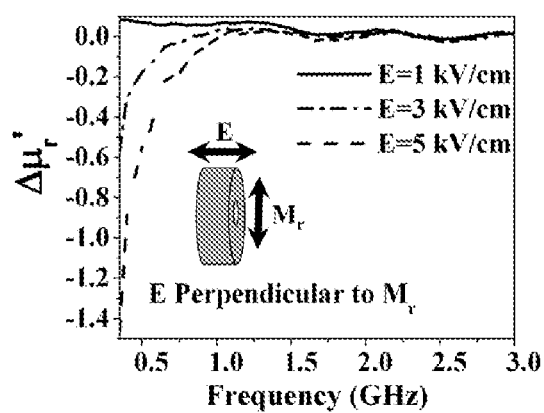
FIG. 7 shows a plot of measured values of permeability change versus electric field and frequency when $M_r$ is perpendicular to E, according to one or more embodiments of the current disclosure.

Hexaferrite material is anisotropic and it is expected that $\Delta\mu'_r$ to be dependent on the direction of $\vec{E}$. Thus, in some embodiments, the ferrite sample was magnetically poled before applying the DC voltage or $\vec{E}$ for permeability measurements, $\vec{M}_r$ was chosen to be parallel, anti-parallel, and perpendicular to the applied electric field direction, $\vec{E}$. Change in permeability versus applied frequency for different E-field values are shown in FIGS. 6 and 7, with E-field parallel and perpendicular to the magnetization, respectively.

The ferromagnetic resonance frequency of hexaferrite is about 2 GHz, Ferromagnetic resonance frequency (FMR) is a measurable property of the material. Additionally, $\Delta\mu'_r$ is about zero for frequencies above 3 GHz. However, by considering the wavelength of the applied microwave signal in comparison with sample and silver paint thickness this technique can be applicable for frequencies up to 10 GHz and DC voltage up to 1000 V. In some embodiments, the frequency range is between 50 MHz and 3 GHz. In some embodiments, the applied voltage range is between 0 and 1000V.

Figure 8:
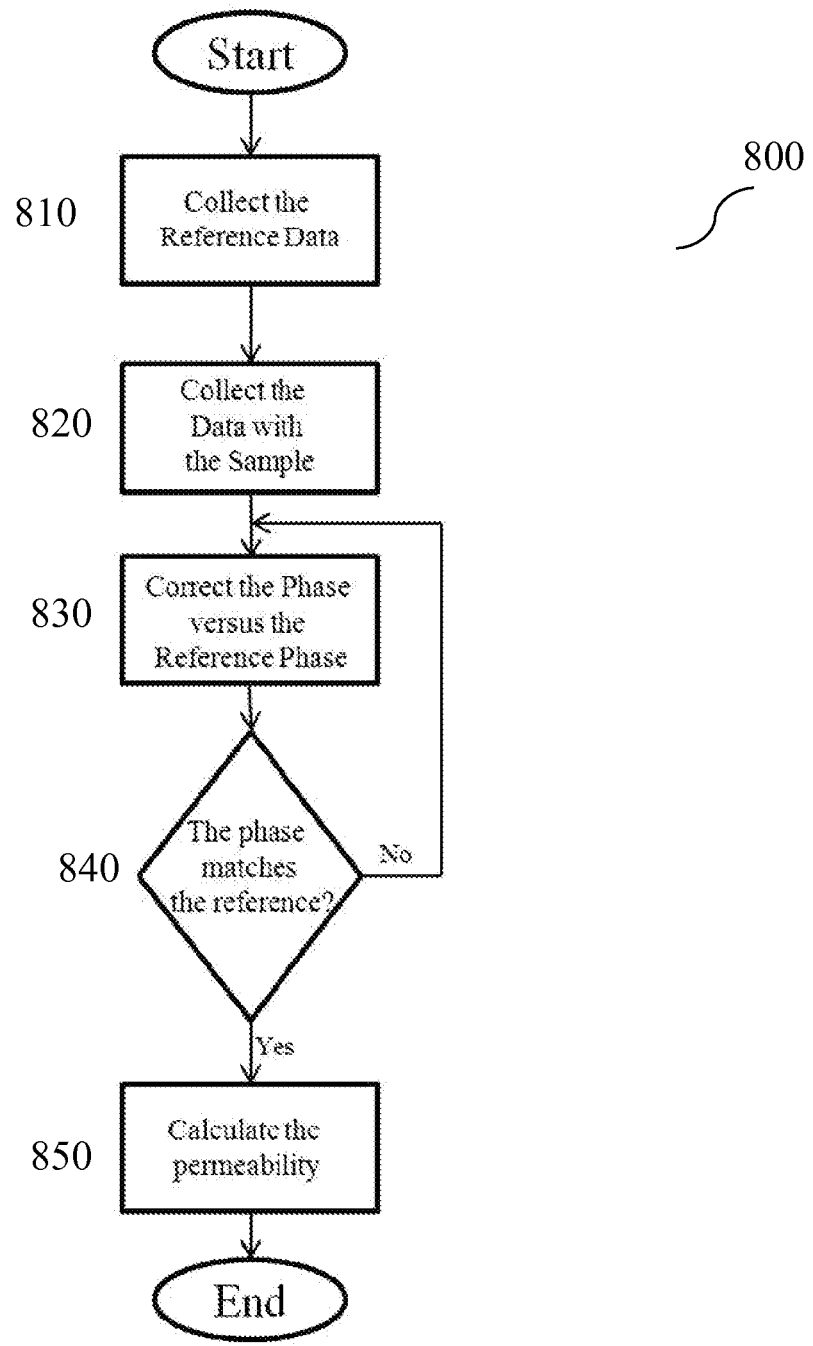
FIG. 8 shows a flow chart of the calibration procedure for the permeability measurements from the sample holder, according to one or more embodiments of the current disclosure.

In some embodiments, a method was developed in order to calibrate the permeability measurements using the sample holder as shown in FIG. 3. Specifically, the method is used to calculate the signal phase effects of isolating the conducting shield 330 from the isolated plate 340 (as the phase of the reflected signal from the terminal end of the cable may be altered due to the presence of the insulating sheet 345 as compared to a holder without any insulating sheet). The method involves collecting the signal data from the sample holder and then reconstructing the data using a series of steps. The steps reduce the raw data obtained from the measurements to changes in permeability versus frequency and DC voltage. A diagram of the procedure 800 is given in FIG. 8. The procedure involves the step of collecting reference data 810 from the sample holder 300 connected via the cable 310 to the permeability analyzer without the sample in place. Then, data is collected from the sample holder with the sample 320 in place 820. The phase of the data is corrected in step 830, as compared to the reference phase collected in step 810. If the phase of the collected data does not match the phase of the reference data 840, the correction step 830 is repeated until a match has occurred. After the phase has been corrected, permeability can be accurately calculated 850. Although it is not shown in the flow chart pictured below, one of skill in the art will recognize that a calibration step (of the permeability analyzer) is included between the start of the algorithm and the collection of the reference data.

Methods of Use (1) Assemble the sample holder without a sample: (a) Position the conductive shield around a portion of the length of the conductive cable, wherein the terminal opening of the conductive shield encloses the terminal end of the conducting cable, (b) Juxtapose a first side of the conductive plate with the terminal opening of the conductive shield, and electrically isolating the first side of the conductive plate from the terminal opening of the conductive shield with an interposed the insulating sheet (c) Connect the conducting end of the conductive cable to a permeability analyzer which transmits a signal to and from the sample holder.

(2) Collect the signal from the permeability analyzer for sample holder without a sample.

(3) Assemble the sample holder with a sample: (a) Prepare a magnetoelectric sample: (i) shape the sample into a torroid with a first and second side and an inner and outer diameter (shaped so that the torroidal sample fills the space between the conducting cable and the conductive shield in an assembled sample holder), (ii) magnetically polarize the sample, and (iii) coat a first side of the sample with a conductive material; (b) position the conductive shield around a portion of the length of the conductive cable, wherein the terminal opening of the conductive shield encloses the terminal end of the conducting cable; (c) position the sample so that the torroidal sample fills the space between the conducting cable and the conductive shield and the inner diameter of the sample is in physical contact with the conducting cable; (d) Juxtapose a first side of the conductive plate with the terminal opening of the conductive shield, and electrically isolating the first side of the conductive plate from the terminal opening of the conductive shield with the insulating sheet, wherein the second side of the sample is in electrical contact with the conductive plate and the conductive material on the first side of the sample electrically connects the sample with the conductive shield; (e) connect an external capacitor between the conductive shield and the conductive plate; (f) establish a voltage difference between the conductive shield and the conductive plate with a DC voltage source to create an electric field through the sample; (g) Connect a second end of the conductive cable to a permeability analyzer which transmits signal to and from the sample holder; and (h) collect the signal from the permeability analyzer for sample holder with a sample.

(4) Analyze collected signal by: (a) adjusting the phase of the signal for the sample holder with a sample to match it to the phase of the signal for the sample holder without a sample, and (b) calculating the permeability of the sample.

The type of measurement described herein is very important in the design of magnetic microwave devices such as liable variable inductor, tunable phase shifter and filler as well as antenna substrates, which are new generation of compact ME based devices where the magnetization is controlled by voltage.

The corresponding structures, materials, acts and equivalents of all means or step plus function elements in the claims below are intended to include any structure, material, or acts for performing the functions in combination with other claimed elements as specifically claimed.

The invention claimed is:

1. A method of measuring permeability comprising:
   (i) providing a combination of a sample in a sample holder, the combination comprising:
      a doughnut-shaped sample positioned in electrical contact with an interior wall of a cylindrical conductive shield at a terminal end of the cylindrical conductive shield;
      a conductive plate juxtaposed to the terminal end of the cylindrical conductive shield, said conductive plate spaced apart and electrically isolated from the cylindrical conductive shield and in electrical contact with the sample;
      a conductor applied to the sample and electrically coupled to the cylindrical conductive shield; and
      a conducting cable passing through a conducting end of the cylindrical conductive shield and in electrical contact with the sample;
   (ii) connecting a conducting end of the cable to a permeability analyzer that emits an electric AC signal and collects a reflected electric AC signal from the sample in the sample holder;
   (iii) applying a DC voltage between the cylindrical conductive shield and the conductive plate, establishing a static electrical field across the sample, from the conductor to the conductive plate; and
   (iv) calculating the permeability of the sample.

2. The method of claim 1, further comprising calibrating the reflected signal from the sample holder with the sample to that of the sample holder without the sample.

3. The method of claim 1, further comprising applying a capacitance between the conductive shield and the conductive plate.

4. The method of claim 1, further comprising magnetically polarizing the sample before providing the sample.

5. The method of claim 1, wherein the sample is magnetoelectric.

6. The method of claim 1, wherein the sample is Sr—Z hexaferrite.

7. The method of claim 1, wherein the sample has resistivity below 107 Ω·cm.

8. The method of claim 1, wherein the sample has a thickness of less than 0.6 cm.

9. The method of claim 1, wherein the permeability analyzer is a network analyzer.

10. A kit for use in measuring permeability of a sample, comprising:
    (i) a sample holder configured to hold the sample, the sample holder comprising:
       a cylindrical conductive shield having a conducting end and a terminal end, the conducting end configured to receive and position a conducting cable longitudinally within the conductive shield;
       a conductive plate sized to close off the terminal end of the cylindrical conductive shield;
       an insulating ring having an inner diameter that is substantially similar to an inner diameter of the cylindrical conductive shield, the insulating ring being disposed between the cylindrical conductive shield and the conductive plate;
       a conductor configured to be (a) applied to the sample and (b) electrically coupled to the cylindrical conductive shield; and
    (ii) instructions for assembling the sample holder.

11. The kit of claim 10, wherein the instructions further comprise instructions for establishing a DC electric field in a sample positioned in an assembled sample holder, receiving and transmitting a signal along the conducting cable positioned in the sample holder, and calculating the permeability of a sample positioned in an assembled sample holder.

12. The kit of claim 11, wherein the instructions comprise instructions for calibrating the signal received from the sample holder.

13. A permeability measuring system comprising:
    (i) a sample holder configured to hold a sample, the sample holder comprising:
       a hollow, cylindrical conductive shield having two open ends, a conducting end and a terminal end, configured to house a conducting cable with a smaller diameter than that of the cylindrical conductive shield, the conducting cable having a conducting end and a terminal end to be aligned with a terminal opening defined by the terminal end of the shield;
       a conductive plate sized to close off the terminal end of the cylindrical conductive shield and configured to be juxtaposed to the terminal end of the cylindrical conductive shield;
       an insulating sheet configured to be disposed between the cylindrical conductive shield and the conductive plate;
       a conductor configured to be (a) applied to the sample and (b) electrically coupled to the cylindrical conductive shield;
    (ii) a DC voltage supply for establishing a voltage difference between the cylindrical conductive shield and the conductive plate, thereby applying an electric field across the sample, the sample disposed within the space between the conducting cable and the conductive shield; and
    (iii) a permeability analyzer that emits a signal and collects reflected signal from the sample holder via the cable in order to measure the permeability of the sample as a function of applied voltage.

14. The system of claim 13, wherein the voltage difference is between 0 and 1000V.

15. The system of claim 13, wherein the electric field established through the sample is perpendicular to sample thickness.

16. The system of claim 13, further comprising an external capacitor connected between the plate and the shield.

17. The system of claim 16, wherein the capacitor has capacitance greater than 0.22 microfarads.

18. The system of claim 13, wherein the insulating sheet comprises Teflon or Mylar.

19. The system of claim 13, wherein the insulating sheet has a thickness of less than its skin depth.

20. The system of claim 13, wherein the permeability analyzer is a network analyzer.

* * * * *